United States Patent
Domingue et al.

(10) Patent No.: US 10,639,630 B2
(45) Date of Patent: May 5, 2020

(54) MICROFLUIDIC TEMPERATURE CONTROL

(71) Applicant: Hewlett-Packard Development Company, L.P., Houston, TX (US)

(72) Inventors: Chantelle Domingue, Corvallis, OR (US); Manish Giri, Corvallis, OR (US); Sadiq Bengali, Corvalis, OR (US)

(73) Assignee: Hewlett-Packard Development Company, L.P., Spring, TX (US)

(*) Notice: Subject to any disclaimer, the term of this patent is extended or adjusted under 35 U.S.C. 154(b) by 255 days.

(21) Appl. No.: 15/545,396

(22) PCT Filed: Jan. 30, 2015

(86) PCT No.: PCT/US2015/013637
§ 371 (c)(1),
(2) Date: Nov. 2, 2017

(87) PCT Pub. No.: WO2016/122553
PCT Pub. Date: Aug. 4, 2016

(65) Prior Publication Data
US 2018/0043356 A1    Feb. 15, 2018

(51) Int. Cl.
*B81B 7/00*     (2006.01)
*B01L 3/00*     (2006.01)
*B01L 7/00*     (2006.01)

(52) U.S. Cl.
CPC ......... *B01L 3/5027* (2013.01); *B01L 3/50273* (2013.01); *B01L 7/00* (2013.01); *B01L 7/52* (2013.01); *B81B 7/0087* (2013.01); *B01L 2200/10* (2013.01); *B01L 2200/147* (2013.01); *B01L 2300/023* (2013.01); *B01L 2300/0861* (2013.01); *B01L 2300/1827* (2013.01); *B01L 2400/0442* (2013.01)

(58) Field of Classification Search
None
See application file for complete search history.

(56) References Cited

U.S. PATENT DOCUMENTS

| | | | |
|---|---|---|---|
| 6,169,394 | B1 | 2/2001 | Frazier et al. |
| 6,379,929 | B1 | 4/2002 | Burns et al. |
| 7,338,637 | B2 | 3/2008 | Pease et al. |
| 2001/0016302 | A1 | 8/2001 | Hirayanagi et al. |

(Continued)

FOREIGN PATENT DOCUMENTS

| | | |
|---|---|---|
| JP | 2005091201 | 4/2005 |
| TW | 201109653 | 3/2011 |

(Continued)

OTHER PUBLICATIONS

Lab-on-a-chip Thermal Management Solutions; Jun. 13, 2011, http://www.electronics-cooling.com/2011/06/lab-on-a-chip-thermal-management-solutions/.

(Continued)

*Primary Examiner* — Paul S Hyun
(74) *Attorney, Agent, or Firm* — Perry + Currier Inc

(57) ABSTRACT

A device includes a microfluidic channel structure on a substrate and a first resistive structure on the substrate to control the temperature of at least the substrate. The first resistive structure is separate from, and independent of the, microfluidic channel structure. In some instances, the device includes a second resistive structure.

14 Claims, 8 Drawing Sheets

(56) References Cited

U.S. PATENT DOCUMENTS

| | | | |
|---|---|---|---|
| 2002/0079219 A1* | 6/2002 | Zhao | B01L 3/502707 |
| | | | 204/451 |
| 2003/0121788 A1 | 7/2003 | Gascoyne et al. | |
| 2004/0005720 A1 | 1/2004 | Cremer et al. | |
| 2011/0048547 A1 | 3/2011 | Hasson et al. | |
| 2011/0120219 A1 | 5/2011 | Barlesi et al. | |
| 2012/0052560 A1 | 3/2012 | Knight et al. | |
| 2012/0244604 A1 | 9/2012 | Kornilovich et al. | |
| 2013/0202278 A1* | 8/2013 | Hong | F04B 19/006 |
| | | | 392/471 |
| 2013/0217102 A1 | 8/2013 | Ganesan et al. | |
| 2014/0051159 A1* | 2/2014 | Bergstedt | B01L 7/525 |
| | | | 435/289.1 |
| 2014/0056580 A1 | 2/2014 | Taniguchi | |
| 2014/0303019 A1 | 10/2014 | Lee et al. | |

FOREIGN PATENT DOCUMENTS

| | | |
|---|---|---|
| TW | 201115143 | 3/2011 |
| TW | 201224455 | 6/2012 |
| WO | WO-2008000060 | 1/2008 |
| WO | WO-2008117194 | 10/2008 |
| WO | WO-2014178827 | 11/2014 |

OTHER PUBLICATIONS

Lee, et al. "MEMS-based Temperature Control Systems for DNA Amplification" May 21, 2002, International Journal of Nonlinear Sciences and Numerical Simulation, vol. 3.3-4, pp. 215 218.

McGuinness et al., Microfluidic Sensing Device, Appln. No. PCT/US2014/0137848; Filed Jan. 30, 2014.

* cited by examiner

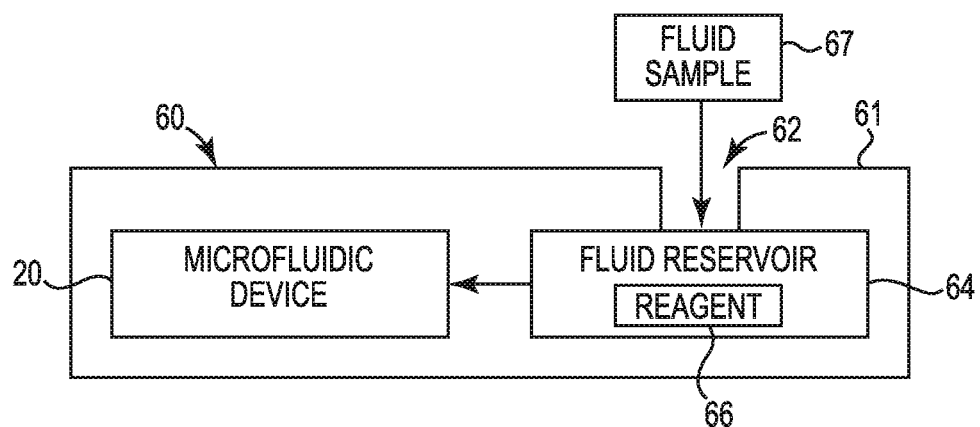
FIG. 3
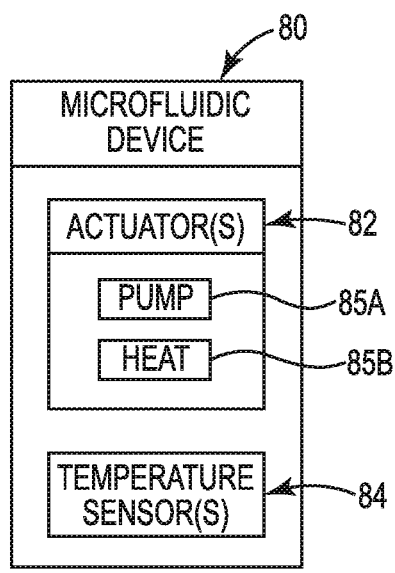
FIG. 4A
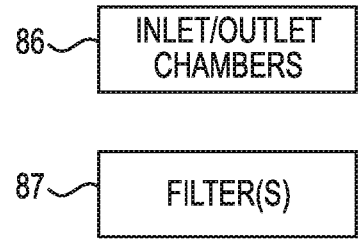
FIG. 4B
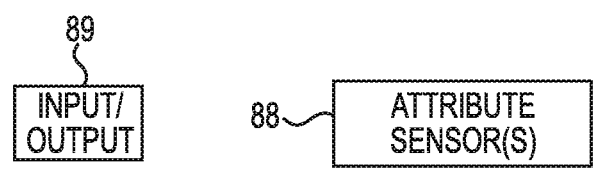
FIG. 4C
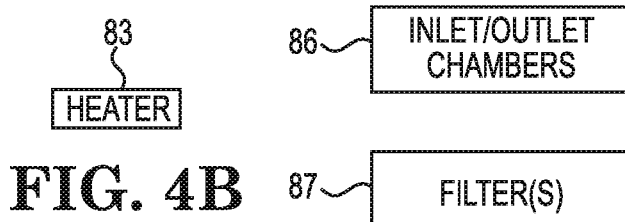
FIG. 5
FIG. 6

MICROFLUIDIC TEMPERATURE CONTROL

BACKGROUND

Microfluidics applies across a variety of disciplines and involves the study of small volumes of fluid and how to manipulate, control and use such small volumes of fluid in various systems and devices, such as microfluidic chips. For example, in some instances a microfluidic chip may be used as a "lab-on-chip", such as for use in the medical and biological fields to evaluate fluids and their components.

BRIEF DESCRIPTION OF THE DRAWINGS

FIG. 3 is a flow diagram schematically illustrating a cassette housing a microfluidic device, according to an example of the present disclosure.

FIG. 4A is a block diagram schematically illustrating a microfluidic device, according to an example of the present disclosure.

FIG. 4B is a block diagram schematically illustrating a heater of a microfluidic device, according to an example of the present disclosure.

FIG. 4C is a block diagram schematically illustrating an input/output element of a microfluidic device, according to an example of the present disclosure.

FIG. 5 is a block diagram schematically illustrating components of a microfluidic device, according to an example of the present disclosure.

FIG. 6 is a block diagram schematically illustrating a component of a microfluidic device, according to an example of the present disclosure.

DETAILED DESCRIPTION

Figure 1:
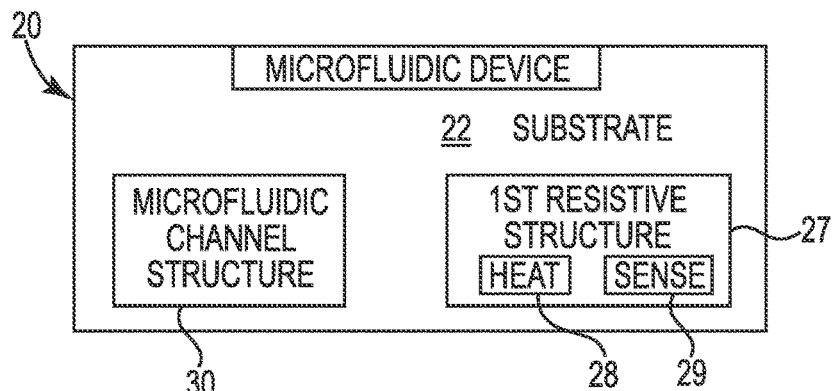
FIG. 1 is block diagram schematically illustrating a microfluidic device, according to an example of the present disclosure.

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense.

At least some examples of the present disclosure are directed to microfluidic devices used to process and evaluate biologic fluids. In some examples, such processing and evaluation involves precise and dynamic temperature control on the microfluidic device. Accordingly, at least some examples of the present disclosure involve controlling the temperature of the substrate as part of controlling the temperature of the microfluidic device as a whole and for the operations occurring thereon.

At least some examples of the present disclosure provide for managing thermal control by employment of thermal sense resistor(s) on the substrate that are in addition to any other temperature sensing and/or heating actions that are more directly associated with the channel structure of the microfluidic device. The thermal sense resistors on the substrate may provide a feedback loop regarding a temperature profile of the substrate and from which decisions are made to selectively apply heat directly to the substrate via the thermal sense resistor(s) and/or to selectively apply heat directly to the fluid and channel structure via other resistive components. Heat applied directly to the fluid, in turn, may heat the substrate.

Accordingly, in some examples, thermal control is managed via maintaining the substrate as a whole at a desired constant temperature and making smaller, more local temperature adjustments throughout the channel structure of the microfluidic device as desired to drive and/or maintain various reaction processes and environments throughout the channel structure of the microfluidic device. The ability to control the temperature of the substrate generally provides a stable temperature platform to enable finer control over local temperature adjustments within the microfluidic channel structure.

However, in some examples of the present disclosure, thermal control includes maintaining different portions of the substrate at different temperatures to facilitate executing different microfluidic operations independently of one another, where each different microfluidic operation involves a different base temperature or a different variable temperature profile to drive a reaction process.

Moreover, when the above-described features are combined with other operational aspects of the microfluidic device, consistent rapid testing is performed. In some examples, such operational aspects of the microfluidic device include the use of on-board pumps, on-board heaters, on-board mixing, and/or on-board sensors, all present on a small footprint substrate.

With this arrangement, in some examples thermal control is maintained at a sensitivity of less than 1 degree Celsius and/or local temperatures changes can be implemented as fast as 1 second.

This arrangement significantly reduces a total time of testing, while ensuring consistent results to thereby make point-of-care diagnostic testing practical for real world, clinical settings and while doing so with relatively low cost test chips.

Managing thermal control, according to at least some examples of the present disclosure, benefits reaction processes driven by and occurring on the microfluidic device. In some examples, these types of reaction processes include, but are not limited to, general molecular diagnosis, DNA amplification, tagging of specific cells for cytology applications, and antigen-antibody binding for detection of specific proteins. To the extent that some of these reaction processes rely on thermal cycling, such as via polymerase chain reactions (PCR), at least some examples of the present disclosure enable precise, rapid, and consistent control to implement the abrupt temperature changes involved in such thermal cycling.

These examples, and additional examples, are described and illustrated in association with at least FIGS. 1-17.

FIG. 1 is a block diagram schematically illustrating a microfluidic device 20, according to an example of the present disclosure. As shown in FIG. 1, the microfluidic device 20 is formed on a substrate 22, and includes a microfluidic channel structure 30. As further shown in FIG. 1, a first resistive structure 27 is formed on the substrate 22. In some examples, the first resistive structure 27 is formed directly on the substrate 22. As noted later, various techniques can be used to form the first resistive structure 27, including but not limited to, micro-fabrication techniques.

The microfluidic channel structure 30 includes an arrangement to move fluid within microfluidic channels while performing different functions such as heating, pumping, mixing, and/or sensing to manipulate the fluid as desired to perform a test or evaluation of the fluid, or to execute a reaction process.

In some examples, the first resistive structure 27 includes a heat component 28 and a sensing component 29. In some examples, the heat component 28 and the sensing component 29 are provided via a single component which can be operated in different modes. For instance, in one example the first resistive structure 27 is implemented via a thermal sense resistor.

In some examples, the thermal sense resistor takes the form of a conductive trace. In some examples, the substrate 22 is formed from a silicon material while in some examples, the first resistive structure 22 is formed from a gold material or platinum material. The first resistive structure 22 exhibits a first thermal coefficient of resistance (TCR) and a first resistance value. In some examples, the first TCR is on the order of $33 \times 10^{-4}$, per degree Celsius (1/° C.)

In one mode, the thermal sense resistor acts solely as a sensor. In another mode, the thermal sense resistor acts as a heater and a sensor. In this mode, a voltage applied to the thermal sense resistor generates energy, which dissipates as heat on the substrate 22. After dissipation of the heat, a resistance of the thermal sense resistor is measured to yield a calculated temperature of the substrate 22.

In some instances, the microfluidic device 20 is referred to as a microfluidic chip or a biologic test chip.

Further details regarding the role and attributes of the first resistive structure 27 in thermal control of the substrate 22 are described below.

Figure 2A:
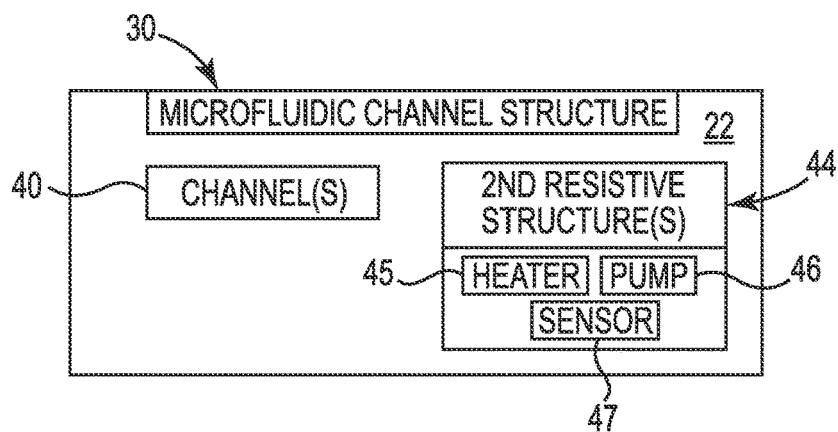
FIG. 2A is a block diagram schematically illustrating a microfluidic channel structure, according to an example of the present disclosure.

As shown in FIG. 2A, in some examples the microfluidic channel structure 30 identified in FIG. 1 includes channel(s) 40 and second resistive structure(s) 44 associated with or within the channel(s) 40. In some examples, second resistive structure(s) 44 include or function as heater element(s) 45, pump element(s) 46, and sensor element(s) 47. The heater elements(s) 45 selectively apply heat to the channel(s) 40 and the fluid within channel(s) 40. Pump element(s) 45 cause fluid to flow via inertial pumping throughout the channel(s) 40 in a desired direction and flow rate. The sensor element(s) 47 sense attributes of the fluid such as temperature, flow rate, as well as other attributes. In some examples, a single resistive element can function as both a heater element 45 and a pump element 46, as further described below in association with at least FIG. 4A.

In some examples, the second resistive structure 44 is made from a Tantalum material, a Tungsten material, an Tantalum-Aluminum material, a Tungsten-Silicon-Nitride (WSiN) material, or a dielectric by which the second resistive structure 44 exhibits a second thermal coefficient of resistance (TCR), such as $55 \times 10^{-4}$, per degree Celsius (1/° C.). In some examples, the second TCR (of the second resistive structure) is a negative value, such as exhibited by a Silicon Nitride material in which the resistance decreases with temperature.

Accordingly, in some examples the second TCR is substantially different than the first TCR, which thereby enables improved temperature resolution of the sensors. For instance, the first TCR is suited to facilitate thermal monitoring of substrate 22 while the second TCR is suited to provide actuation functions such as heating, pumping, etc.

In some examples, the second resistive structure 44 has a second resistance value that is greater than the first resistance value of the first resistor structure 27. In some examples, the second resistive structure 44 has a second resistance value that is substantially greater than the first resistance value of the first resistor structure 27.

In some examples, the first resistive structure 27 (FIG. 1) is electrically separate from, and independent of, the second resistive structure(s) 44. This arrangement ensures a direct relationship between the first resistive structure 27 and the substrate 22 to facilitate thermal control of the substrate 22.

In some examples, the first resistive structure 27 has a substantially different shape, a substantially different size, a substantially different resistivity, and a substantially different TCR than the second resistive structure(s) 44. In some examples, this arrangement enables the second resistive structure(s) 44 to act as thermal sensors but to also selectively provide functions of heating and pumping that are not implementable via the first resistive structure 27.

Figure 2B:
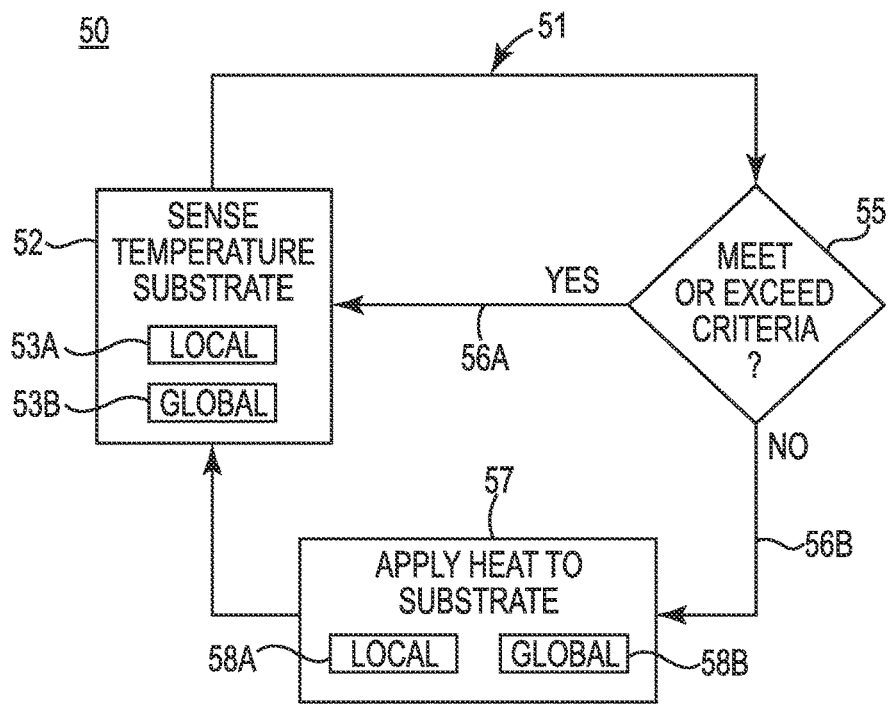
FIG. 2B is a diagram schematically illustrating a thermal control feedback loop, according to an example of the present disclosure.

FIG. 2B is a flow diagram 50 schematically illustrating a thermal control feedback loop 51, according to an example of the present disclosure, in association with operation of the microfluidic device 20 as previously described in association with at least FIGS. 1-2A and later described in association with FIGS. 3-17. As shown at block 52 in FIG. 2B, a temperature of the substrate 22 of the microfluidic device 20 is sensed. In some examples, the sensed temperature is a global temperature 53B of the substrate 22, such as measured via resistive element(s) of first resistive structure 27, which extend over a large portion of the substrate 22. One example of such first resistive structure(s) 27 is further described later in association with at least FIGS. 10, 12.

In some examples, the sensed temperature is a local temperature 53A of a portion of the substrate 22, such as measured via resistive element(s) of first resistive structure 27 located at a portion of the substrate 22. One such example is further described later in association with at least FIG. 13.

However, it will be understood that in some examples, some local temperature sensing can be implemented via resistive elements associated with the microfluidic channel 30, such as via second resistive structure 44 or other resistive elements associated with the microfluidic channel structure 30.

In some examples, local temperature sensing of the substrate 22 occurs at higher frequency (i.e. more often) than global temperature sensing of the substrate because, in some instances, the local temperature sensing captures more rapid thermal effects of local microfluidic phenomenon, whereas the global temperature sensing captures more gradual changes in temperature for the entire substrate 22.

After sensing the temperature of the substrate 22, at block 55 in FIG. 2B a determination is made whether the sensed temperature meets or exceeds criteria, such as a target temperature. The target temperature can be a minimum, a maximum or other parameter. For example, in order to perform tests or operations involving biologic particles within the microfluidic device 20, a minimum temperature rate may be involved or a maximum temperature may be involved, each of which facilitate the respective test or operation.

In some examples in which there may be multiple different target local temperatures of the substrate 22, the determination at block 55 queries whether each of those local target temperatures of the substrate meet or exceed the criteria for the particular location at which those temperatures are measured.

If the answer to the query at block 55 is YES, path 56A is taken to block 52 for further temperature sensing. If the answer to the query at block 55 is NO, path 56B is taken to block 57 for application of heat to the substrate 22 to change the temperature of the substrate 22. In some examples, heat is applied globally (58B) while in some examples, heat is applied locally (58A) to certain portions of the substrate 22 independent of other local portions of the substrate 22.

After such heating, control in loop 51 returns to block 55 for further temperature sensing of the substrate 22.

By employing feedback loop 51, a temperature of the substrate 22 is maintained as desired, which in turn, facilitates maintaining thermal control of activities and operations on the microfluidic device 20, such as (but not limited to), reaction processes within the channels (40) of the microfluidic device 20.

In some examples, at least some information relating to the operation of feedback loop 51 is communicated from the microfluidic device 20 to external components and devices for further processing and control actions regarding the microfluidic device 20.

After providing further information in association with at least FIGS. 3-9 regarding a device environment in which the microfluidic device 22 functions, further details will be provided in association with at least FIGS. 10-17 regarding more features and attributes regarding thermal control of the substrate 22 associated with a microfluidic device 20 and at least the role of first resistive structure 27 in doing so.

FIG. 3 is a block diagram schematically illustrating a module 60 including a microfluidic device 20 (FIGS. 1-2), according to an example of the present disclosure. In some instances, the module is referred to as a cassette or container. As shown in FIG. 3, module 60 includes a housing 61 that at least partially contains and/or supports microfluidic device 20.

In some examples, as shown in FIG. 3 fluid reservoir 64 is defined within housing 61 in close proximity to microfluidic device 20 to enable fluid communication therebetween. As shown via FIG. 3, the fluid sample 67 is deposited (via inlet 62) to enter fluid reservoir 64 and mix with reagent(s) 66 before flowing into microfluidic device 20. In some instances, microfluidic device 20 includes its own reservoir to initially receive the fluid sample (mixed with reagents 66) from reservoir 64 before the fluid flows into channels of the microfluidic device 20.

If the fluid sample 67 is blood, then in some examples the reagent(s) 66 includes an anti-coagulant, such as ethylenediamine tetraacetic acid (EDTA), and/or buffer solution such as phosphate buffered saline (PBS). In some examples, a suitable blood sample has volume of about 2 microliters while the reagent has a volume of about 8 microliters, leading to a volume of 10 microliters to be processed via the microfluidic device 20. Accordingly, in this arrangement, a dilution factor of about 5 is applied to the fluid sample of whole blood. In some examples, dilution factors of more than or less than 5 are applied to whole blood. In some examples, such low dilution factors ensure a high signal-to-noise ratio when a sense volume of the fluid (to be tested) passed through a sensing region. In addition, lower dilution factors involve a smaller total volume of fluid to be processed by the microfluidic device 20, which in turn reduces the total test time for the particular fluid sample. In some examples, a dilution factor that is equal to or less than ten is employed.

In some examples, whether the fluid sample 67 is blood or another type of biological fluid, volumes greater or less than 2 microliters can be used. In addition, in some examples, whether the fluid sample 67 is blood or another type of biologic fluid, reagent volumes greater or less than 8 microliters can be used. In some examples, a fluid sample 67 is also diluted with other or additional fluids other than reagents 66.

It will be further understood that when whole blood is the fluid sample 67, in some examples the reagent(s) 66 include other or additional reagents to prepare the blood for a diagnostic test of interest. In some examples, such reagent(s) 66 help sensors identify certain particles in the fluid sample in order to track them, count them, move them, etc. In some examples, such reagent(s) 66 bind with certain particles in the fluid sample 67 in order to facilitate excluding or filtering those certain particles from the fluid to better isolate or concentrate a particular biologic particle of interest. In some examples, the operation of the reagent(s) 66 works in cooperation with filters and/or other sorting and segregation mechanisms to exclude certain biologic particles from a sensing region of the microfluidic device 20.

In some examples, reagent(s) 66 include materials suitable to perform antibody-antigen binding for micro-particle tagging and/or materials suitable to implement nano-particle tagging techniques, magnetic particle sorting techniques, and/or high density particle tagging techniques.

In some examples, at least some reagent(s) 66 include lysing agents, such as (but not limited to) when it is desired to separate out red blood cells prior to implementing subsequent counting or analysis of white blood cells.

Of course, in the event that the fluid sample 67 is not blood but is a different biologic fluid, such as urine, spinal fluid, etc., then reagent(s) 66 would include an appropriate type and number of reagent(s) 66 suited to handling such fluids and to achieve the desired separation and sorting of the components of those fluids.

In some examples, reagent(s) 66 are provided to prepare for, initiate, execute, and/or terminate various reaction processes such as, but not limited to, processes to perform molecular diagnoses and related tasks as previously mentioned.

FIG. 4A is a block diagram schematically illustrating a microfluidic device 80, according to an example of the present disclosure. In some examples, microfluidic device 80 includes at least some of substantially the same features and attributes as microfluidic device 20 of FIGS. 1-3. In some examples, at least some components of microfluidic device 80 of FIG. 4A are incorporated within the microfluidic device 20 of FIGS. 1-3.

As shown in FIG. 4A, microfluidic device 80 includes actuator(s) 82 and temperature sensor(s) 84, with actuators 82 functioning as a pump 85A and/or as a heater 85B. In some examples, actuator 82 comprises a resistive element, such as a thermal resistor, and therefore defines at least some of the second resistive structure(s) 44. When activated at a high intensity, and sufficient pulse width, the actuator 82 causes formation of nucleating vapor bubble that displaces fluid within the channel structure 30 to drive fluid along and through the channel structure 30. As a byproduct, a moderate amount of heat is produced. In one aspect, such high intensity activation involves a relatively short pulse width, and higher power.

However, when activated at a low intensity and insufficient pulse width, the actuator 82 does not act as a pump because insufficient energy is present to cause significant fluid displacement. Instead, heat is produced, such that actuator 82 functions as a heater 85B without displacing fluid. In one aspect, such low intensity activation involves a relatively longer pulse width, and lower power.

In some examples, microfluidic device 80 includes temperature sensor(s) 84 to track a temperature of at least the channel structure 30 and the fluid therein to facilitate managing reaction processes associated with implementing a test of interest on a given biologic fluid present within the channel structure 30. In one example, the temperature sensor(s) 84 is a resistive element that changes resistance as a function of the temperature of the resistive element.

A later described control interface 106 is couplable to an electrical interface of the microfluidic device for energizing and controlling operations of the actuator(s) 82 and temperature sensor(s) 84. In some examples, the structures and components of the chip-based microfluidic device 20, 80 are fabricated using integrated circuit microfabrication techniques such as electroforming, laser ablation, anisotropic etching, sputtering, dry and wet etching, photolithography, casting, molding, stamping, machining, spin coating, laminating, and so on.

FIG. 4B is a block diagram schematically illustrating a heater element 83 of a microfluidic device such as in FIG. 4A, according to an example of the present disclosure. The heater element 83 includes a resistive element dedicated to applying heat to the microfluidic channel structure 30, and does not provide other functions, such as fluid actuation. Accordingly, in some examples, a microfluidic device 20, 80 can include dedicated heater elements 83 separate from and independent of actuator(s) 82 and which can be employed to selectively apply heat.

FIG. 4C is a block diagram schematically illustrating an input/output element 89 of a microfluidic device such as the microfluidic device 20, 80 in FIGS. 1-4A, according to an example of the present disclosure. The input/output element 89 enables communication of data, power, control signals, etc. to/from external devices, which facilitate operation of the microfluidic device 20, 80, and which are further described later in association with at least FIGS. 7-10.

FIG. 5 is a block diagram schematically illustrating components 86, 87 of a microfluidic device, according to an example of the present disclosure. In some examples, a microfluidic device such as device 20, 80 (FIGS. 1-4C) further includes inlet/outlet chambers 86 and/or filters 87. The inlet/outlet chambers enable fluid to enter and exit various portions of the channel structure 30 while filters 87 segregate different components of a fluid from each other, such as excluding larger particles from further passage through the microfluidic channel structure 30, as further noted later.

FIG. 6 is a block diagram schematically illustrating an attribute sensor(s) 88 of a microfluidic device, according to an example of the present disclosure. In some examples, a microfluidic device such as device 20, 80 (FIGS. 1-4A) further includes an attribute sensor(s) 88 to detect pH, flow rate, identification of particular biologic particles, etc. In some examples, the attribute sensor 88 comprises an impedance sensor to count biologic particles flowing through channel(s) 40.

Figure 7:
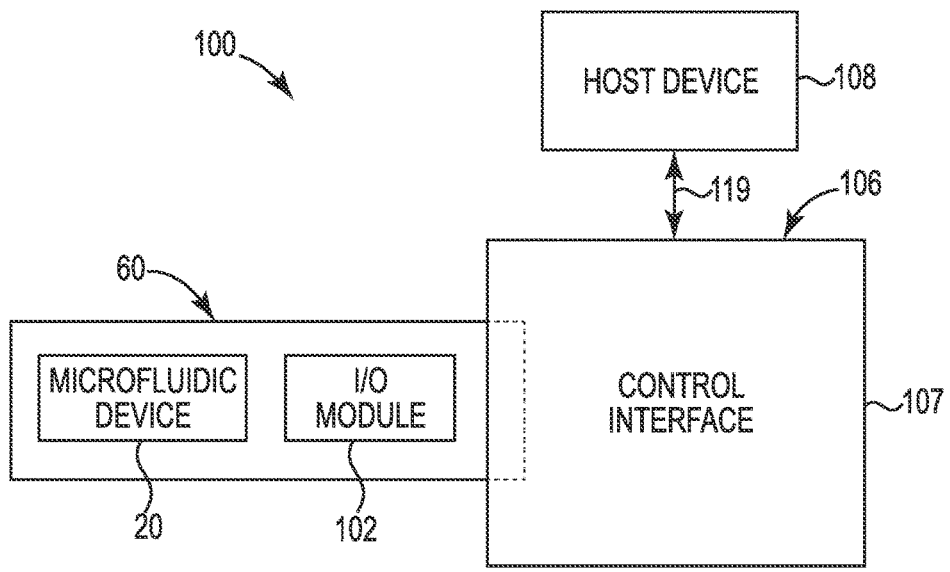
FIG. 7 is a block diagram schematically illustrating a microfluidic test system, according to an example of the present disclosure.

FIG. 7 is a block diagram schematically illustrating a microfluidic test system, according to an example of the present disclosure. As shown in FIG. 7, system 100 includes a cassette 60, a control interface 106 (with housing 107), and a host device 108. In some examples, cassette 60 includes at least some of substantially the same features and attributes as cassette 60, as previously described in association with at least FIG. 3, and with microfluidic device 20 including at least some of substantially the same features and attributes as microfluidic device 20, 80, as previously described in association with at least FIGS. 1-6.

As shown in FIG. 7, in addition to at least microfluidic device 20, cassette 60 includes an input/output (I/O) module 102 to communicate power, data, and/or control signals, etc. between the microfluidic device 20 (within cassette 60) and the control interface 106, which is in turn in communication with the host device 108. In some examples, the I/O module 102 of cassette 60 interfaces with the I/O element 89 of microfluidic device 80.

In some examples, as shown in FIG. 7, cassette 60 is removably couplable to the control interface 106 so that it can be coupled and uncoupled as desired. The control interface 106 is removably couplable to the host device 108 as further described below. In some instances, the control interface 106 is referred to as, or embodied as, a dongle or connector.

In general terms, a fluid sample 67 (FIG. 3) is processed through microfluidics and subject to various functions or reaction processes before being exposed to a sensing region in the microfluidic device 20 under control of the control interface 106. The microfluidic device 20 provides an electrical output signal representing the sensor data to the control interface 20. With the control interface 20 under control of the host device 108, the host device 108 can send and receive data to and from the control interface 106, including command information for controlling the microfluidic device 20, for performing thermal management of substrate 22, and/or obtaining sensor data obtained from the microfluidic device 20.

Figure 8:
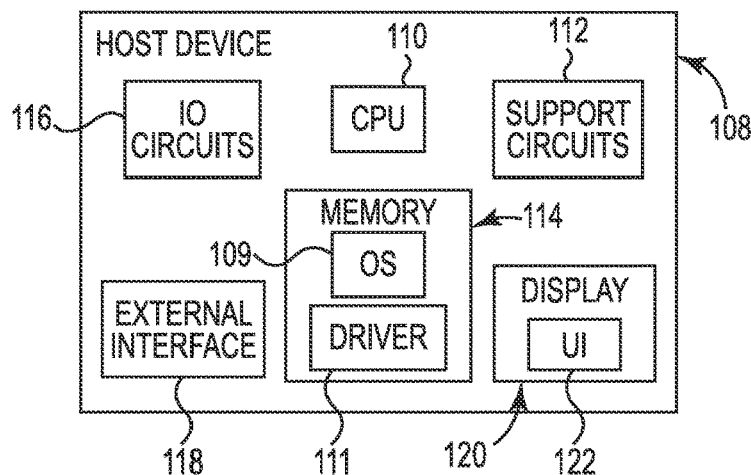
FIG. 8 is a block diagram schematically illustrating a host device of the system of FIG. 7, according to an example of the present disclosure.

FIG. 8 is a block diagram schematically illustrating the host device 108 (FIG. 7), according to an example of the present disclosure. As shown in FIG. 8, in some examples, the host device 108 generally includes a central processing unit (CPU) 110, various support circuits 112, memory 114, various input/output (IO) circuits 116, and an external interface 118. The CPU 110 includes a microprocessor. In some examples, the support circuits 112 include a cache, power supplies, clock circuits, data registers, and the like. In some examples, the memory 114 includes random access memory, read only memory, cache memory, magnetic read/write memory, or the like or any combination of such memory devices. In some examples, the IO circuits 116 cooperate with the external interface 118 to facilitate communication with the control interface 106 over a communication medium 119 (shown in FIG. 7). The communication medium 119 can involve any type of wired and/or wireless communication protocol and can include electrical, optical, radio frequency (RF), or the like transfer paths.

In some examples, the external interface 118 includes a universal serial bus (USB) controller capable of sending and receiving data to the control interface 106, as well as providing power to the control interface 106, over a USB cable. It is to be understood that in some examples, other types of electrical, optical, or RF interfaces to the control interface 106 are used to send and receive data and/or provide power.

In some examples, as shown in FIG. 8, the memory 114 of host device 108 stores an operating system (OS) 109 and a driver 111. The OS 109 and the driver 111 include instructions executable by the CPU 110 for controlling the host device 108 and for controlling the control interface 106 through the external interface 118. The driver 111 provides an interface between the OS 109 and the control interface 106. In some examples, the host device 108 comprises a programmable device that includes machine-readable instructions stored in the form of software module(s), for example, on non-transitory processor/computer readable-media (e.g., the memory 114).

In some examples, as shown in FIG. 8, the host device 108 includes a display 120 through which the OS 109 can provide a graphical user interface (GUI) 122. A user can use the user interface 122 to interact with the OS 109 and the driver 111 to control the control interface 106, and to display data received from the control interface 106. It will be understood that the host device 108 can be any type of general or specific-purposed computing device. In an example, the host device 108 is a mobile computing device, such as a "smart phone," "tablet" or the like.

Figure 9:
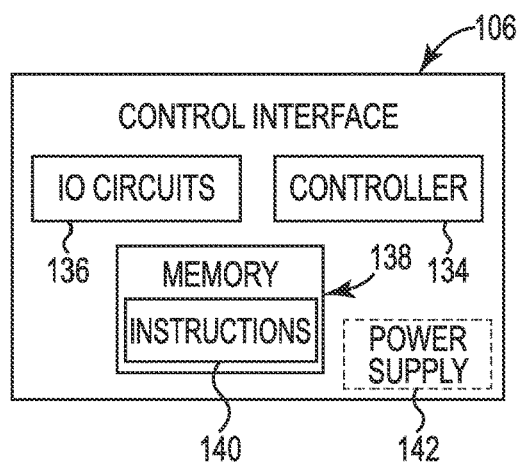
FIG. 9 is a block diagram schematically illustrating a control interface of the system of FIG. 7, according to an example of the present disclosure.

FIG. 9 is a block diagram schematically illustrating the control interface 106, according to an example of the present disclosure. In one example, the control interface 106 includes a controller 134, 10 circuits 136, and a memory 138. The controller 134 comprises a microcontroller or microprocessor. In some examples, control interface 106 receives power from the host device 108, while in some examples, the control interface 106 includes a power supply 142.

In some examples, memory 138 stores instructions 140 executable by the controller 134 for at least partially controlling the microfluidic device 20 and/or for communicating with the host device 108. As such, the control interface 106 comprises a programmable device that includes machine-readable instructions 140 stored on non-transitory processor/computer readable-media (e.g., the memory 138). In other examples, the control interface 106 may be implemented using hardware, a combination of hardware and instructions 140 stored in memory 138. For instance, in some examples all or a portion of the control interface 106 is implemented using a programmable logic device (PLD), application specific integrated circuit (ASIC), or the like.

In some examples, driver 111 in memory 114 of host device 108 and/or memory 138 of control interface 106 stores machine readable instructions to implement and/or operate thermal control management of substrate 22. In some examples, such thermal control management is implemented via a thermal control manager 400 and/or a process type module 500, as later further described in association with at least FIGS. 14-15.

Figure 10:
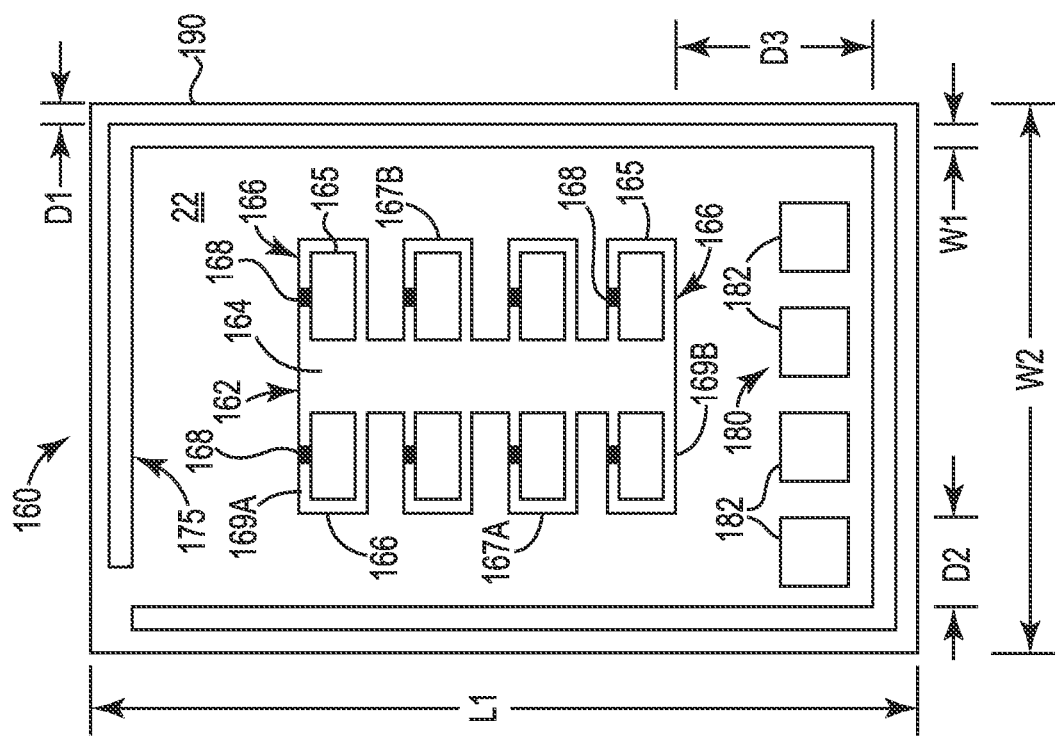
FIG. 10 is a top plan view schematically illustrating a microfluidic device, according to an example of the present disclosure.

FIG. 10 is a top plan view illustrating a microfluidic device 160, according to an example of the present disclosure. In some examples, the microfluidic structure 160 includes at least some of substantially the same features and attributes as the microfluidic devices (e.g. 20, 80) as previously described in association with at least FIGS. 1-9, and therefore is suited to implement thermal control management of substrate 22 as described throughout the present disclosure.

As shown in FIG. 10, microfluidic device 160 includes a substrate 22 on which is formed a first resistive structure 175 and microfluidic channel structure 160, and input/output portion 180. As noted previously, in some examples the substrate is made of a silicon material. In some examples, the substrate 22 has a length (L1) of about 2 millimeters, a width (W2) of about 1 millimeter, and a thickness of about 1 millimeter, with a mass of about 2 micrograms. In some examples, the substrate includes a central slot having dimensions on the order of a 1 millimeter length, and a 50 to 500 micrometer width, thereby providing the substrate 22 with a high surface-to-volume ratio. Given the high conductivity of silicon, and the low thermal mass of the substrate 22, rapid heating is achievable, which in turn enables rapid heating of fluids within the microfluidic channel structure 162, thereby expediting establishment of operational conditions and/or implementing rapid temperature adjustments.

As shown in FIG. 10, in some examples the first resistive structure 175 has a shape and size that generally corresponds to a periphery or outer edge 190 of substrate 22. For instance, in the example shown in FIG. 10, the substrate 22 has a generally rectangular shape and the first resistive structure 175 has a generally matching, rectangular ring shape. In addition, per the small spacing represented by D1 in FIG. 10, the generally rectangular shape of the first resistive structure 175 is sized to position the first resistive structure 175 in close proximity to the outer edge 190 (e.g. periphery) of the substrate 22. In some examples, the first resistive structure 175 has a width (W1) and the distance D1 is on the order of W1.

In this example, the first resistive structure 175 is spaced apart by a distance (D2) from the outer edges 167A, 167B of the microfluidic channel structure 162 and by a distance (D3) from the outer edges 169A, 169B of microfluidic channel structure 162, with edges 167A, 167B, 169A, 169B generally defining a periphery of the microfluidic channel structure 162. In some examples, D2 and D3 are co-equal.

In some examples, D2 or D3 is a significant multiple (5 times) or an order of magnitude larger than W1. In one aspect, in addition to the first resistive structure 175 being electrically independent and separate from the second resistive structures (e.g. resistive elements 168), the distances (D2, D3) ensure that the temperature sensed via first resistive structure 175 is significantly representative of the (overall) temperature of the substrate 22 (apart from microfluidic channel structure 30).

As further shown in FIG. 10, the microfluidic channel structure 162 includes an array of microfluidic channel units 166 arranged about and in fluid communication with centrally located reservoir 164. It will be understood, however, that the units 166 are not strictly limited to the particular size, shape, and position shown in FIG. 10, and instead can exhibit other sizes, shapes, and positions. In some examples, at least some of the microfluidic channel units 166 include second resistive elements 168, which serve as a second resistor structure 44 (FIG. 2A). In some examples, the second resistive elements 168 include heater elements 83 (FIG. 4B) or actuators 82 (FIG. 4A), which can function as heaters and/or pumps.

In some examples, second resistive elements 168 have a size and shape substantially different than the first resistive structure 175. In some examples, each second resistive element 168 has a length (L2) that is at least two orders of magnitude less than a length of first resistive structure 175. For illustrative clarity, the length L2 is represented by length L2 as later depicted for resistive element 204 (i.e. actuator) in FIG. 11. In some examples, each second resistive element 168 has a block shape unlike the rectangular-shaped ring of first resistive structure 175 that extends about periphery of substrate 22.

It will be understood, however, that the second resistive elements 168 are not strictly limited to the particular size, shape, and position shown in FIG. 10, and instead can exhibit other sizes, shapes, and positions while still functioning as second resistive structures (44 in FIG. 2A).

However, in some examples (not shown in FIG. 10), second resistive elements 168 have a size and shape similar to a size and shape of the at least some of the channels 165 of the microfluidic channel structure 162.

In some examples, more particular details regarding one of the microfluidic channel units 166 are described later in association with at least FIG. 11.

Figure 11:
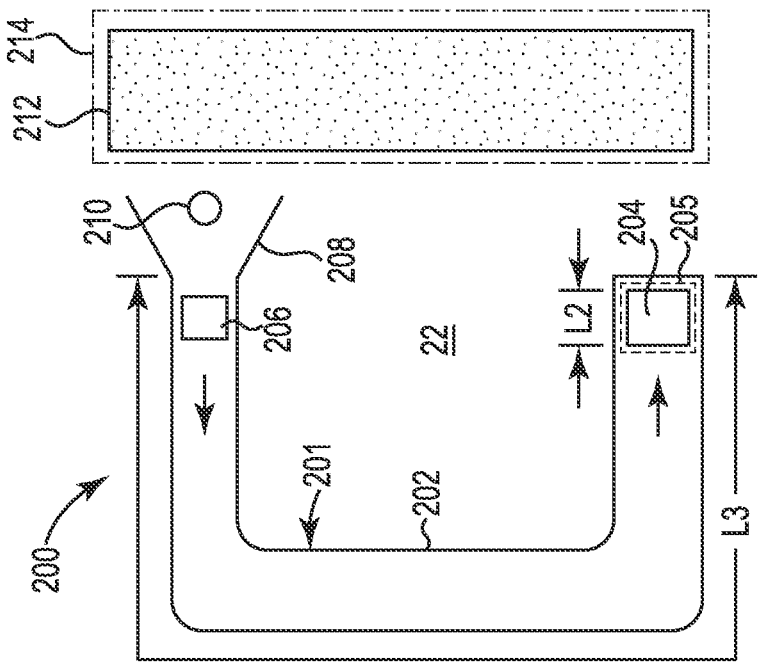
FIG. 11 is a top plan view schematically illustrating a portion of a microfluidic device including a channel structure and associated components, according to an example of the present disclosure.

FIG. 11 is a diagram schematically illustrating a microfluidic structure 200 of a portion of a microfluidic device 20, according to an example of the present disclosure. In some examples, the microfluidic structure 200 includes at least some of substantially the same features and attributes as microfluidic device 20, 80 as previously described in association with at least FIGS. 1-9.

In some examples, the microfluidic device 200 represents one example implementation of a microfluidic channel unit 166 shown in FIG. 10.

As shown in FIG. 11, in some examples the microfluidic structure 200 includes a microfluidic channel 202, a fluid actuator 204, a sensor 206, a nozzle 205 (e.g., outlet), and an inlet 208. FIG. 10 also depicts a fluid reservoir 214, which is in communication with the fluid reservoir 64 of cassette 60 (FIG. 3). In some examples, channel 202 corresponds to a respective one of the channels 165 (of a microfluidic channel unit 166) in FIG. 10.

In some examples, as further shown in FIG. 11 a mesh filter 212 is provided in the fluid reservoir 214 for filtering particles in the applied fluid sample. While the shape of the fluid channel 202 in FIG. 10 is shown as being "U-shaped", this is not intended as a general limitation on the shape of the channel 202. Thus, the shape of the channel 202 can include other shapes, such as curved shapes, serpentine shapes, shapes with corners, combinations thereof, and so on. Moreover, the channel 202 is not shown to any particular scale or proportion. The width of the channel 202 as fabricated on a device can vary from any scale or proportion shown in the drawings of this disclosure. The arrows in the channel indicate an example direction of fluid flow through the channel.

The inlet 208 provides an opening for the channel 202 to receive the fluid. The filter 210 is disposed in the inlet 208 and prevents particles in the fluid of a particular size (depending on the size of the filter 210) from entering the channel 202. In some examples, the inlet 208 can have a larger width and volume than the channel 202. For instance, the inlet 208 can define a progressively narrowing cross-sectional area in the downstream orientation.

In some examples, the sensor 206 is disposed in the channel 202 near the inlet 208 (e.g., closer to the inlet 208 than the pump actuator 204) as shown in FIG. 10. In some examples, the sensor 206 is disposed in the inlet 208. In some examples, the sensor 206 is an impedance sensor and detects impedance changes as biologic particles in the fluid pass over the sensor 206.

As further shown in FIG. 11, in some examples the fluid actuator 204 (e.g. pump) is disposed near a closed end of the channel 202 downstream from the sensor 206. The fluid actuator 204 can be a fluidic inertial pump actuator, which can be implemented using a wide variety of structures. In some examples, the fluid actuator 204 is a thermal resistor that produces vapor bubbles to create fluid displacement within the channel 202. The displaced fluid is ejected from the nozzle 405, thereby enabling an inertial flow pattern within/through channel 202. In some examples, fluid actuator 204 is implemented as piezo elements (e.g., PZT) whose electrically induced deflections generate fluid displacements within the channel 202. Other deflective membrane elements activated by electrical, magnetic, and other forces are also possible for use in implementing the fluid actuator 204.

In some examples, the fluid actuator 204 causes fluid displacements of less than ten picoliters and can be activated at a frequency ranging from 1 Hz to 100 kHz.

In general terms, the fluid actuator 204 is positioned in sufficiently close proximity to sensor 20 to ensure high fluid flow rates. Although not shown, in some examples, fluid actuator 204 is positioned to cause inertial pumping that pushes biologic particles through the region at sensor 206 while in some examples, fluid actuator 204 is positioned to cause inertial pumping that pulls biologic particles through the region at sensor 206, as shown in FIG. 11.

Consistent with the previously described microfluidic device (20 in FIG. 1-2A, 80 in FIG. 4A), when operated at an appropriate pulse width and intensity, the actuator 204 also acts a heater to heat fluid within channel 202. As previously noted, in such instances the thermal resistor/actuator 204 is operated in a pulse mode in which the activation occurs at a lower intensity, and a longer pulse width to provide a pulse of heat to the fluid without forming a nucleating bubble.

Accordingly, when actuator 204 is embodied as a thermal resistor, actuator 204 provides one example of a respective one of the resistive elements 168 in channel 167 as shown in FIG. 10.

In some examples, as further shown in FIG. 11, the resistive element defining actuator 204 has a length L2, which is substantially less than an overall length (L3) of channel 202 (and therefore channel 165 in FIG. 10). In some examples, the length L2 is at least one order of magnitude less than length L3.

In some examples, channel 202 includes more than one actuator 204, such that more than one heater can be arranged within a single channel 202.

Whether there are one, two, or three resistive elements 204 (168 in FIG. 10) in channel 202, this arrangement enables precise control over how much heat is applied to the fluid in the channel and at which locations. This arrangement stands in contrast to some commercially available arrangements in which a resistive element extends substantially an entire length of a fluid chamber and activation of the resistive element involves applying heat along the entire length of the fluid chamber.

In some examples, additional heaters are employed within channel 202 and/or additional thermal sense resistors are employed on the substrate 22 to provide the desired thermal control arrangement, such as later further described in association with at least FIG. 13.

In some examples, the particular array of heaters and thermal sense resistors is arranged to optimize a particular aspect of a reaction process. In some examples a different microfluidic device or chip is provided to perform a different reaction process (because different constant temp or different variable temp profile involved in executing that particular reaction process). In some examples, a single microfluidic device performs different reaction processes, but does so by providing different channel units 166 to do so, with each different channel unit 166 being dedicated to performing a different reaction process or a different portion of a reaction process.

In some examples, as further described later in association with at least FIG. 16, a single microfluidic device includes a series of thermal control zones, with each thermal control zone providing independent thermal control over a reaction process in the particular portion of the channel structure of that respective thermal control zone. In some examples, as further described later in association with at least FIG. 17, a single microfluidic device provides parallel zones in which each different zone provides independent thermal control over a reaction process in the channel structure of that respective zone.

Figure 12:
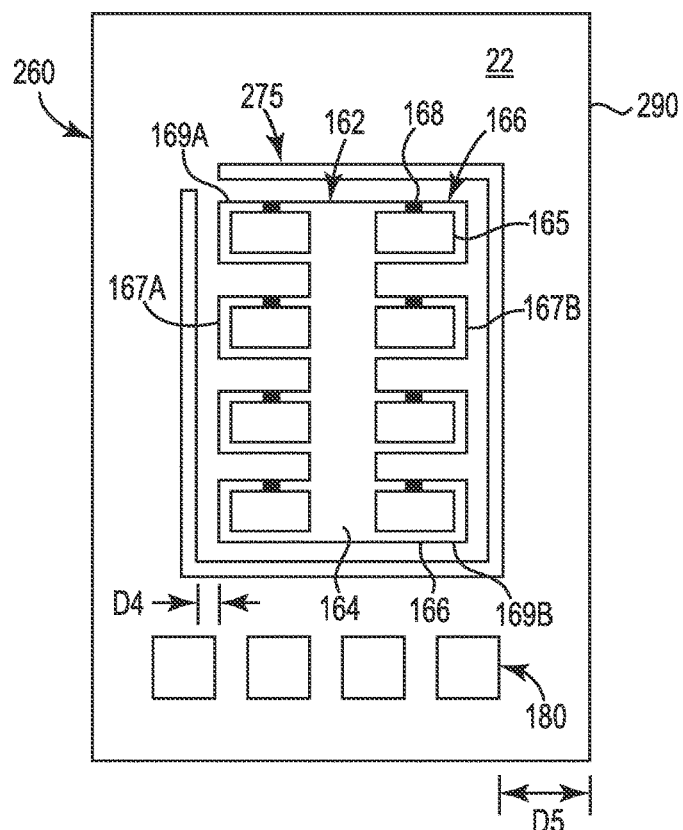
FIG. 12 is a top plan view schematically illustrating a microfluidic device, according to an example of the present disclosure.

FIG. 12 is a top plan view schematically illustrating a microfluidic device 260, according to an example of the present disclosure. In some examples, microfluidic device 260 includes at least substantially the same features and attributes as microfluidic device 160 (as previously described in association with at least FIG. 12), except for locating a first resistive structure 275 in close proximity to the microfluidic channel structure 162. As shown in FIG. 12, in some examples the first resistive structure 275 is spaced apart by a distance D4 from the outer edges 167A, 167B, 169A, 169B (e.g. periphery) of microfluidic channel structure 162. In some examples, the first resistive structure 275 is spaced apart by a distance D5 from the outer edge 290 of the substrate 22. As shown in FIG. 12, first resistive structure 275 maintains a rectangular-shaped ring like first resistive structure 175 (FIG. 10), and which at least partially surrounds the microfluidic channel structure 162. However, as noted above, the first resistive structure 275 is in close proximity to the periphery of the microfluidic channel structure 162. In some examples, the distance D4 is approximately equal to the width (W1) of first resistive structure 275. In some examples, distance D5 is a multiple of distance D4.

In some examples, the first resistive structure 275 enables sensing a temperature of the substrate 22 in close proximity to the microfluidic channel units 166 at which reaction processes (and/or other operations) are taking place. In one aspect, this arrangement enables adjusting the temperature of the substrate 22 more specifically to the temperature variances due to the reaction processes.

Figure 13:
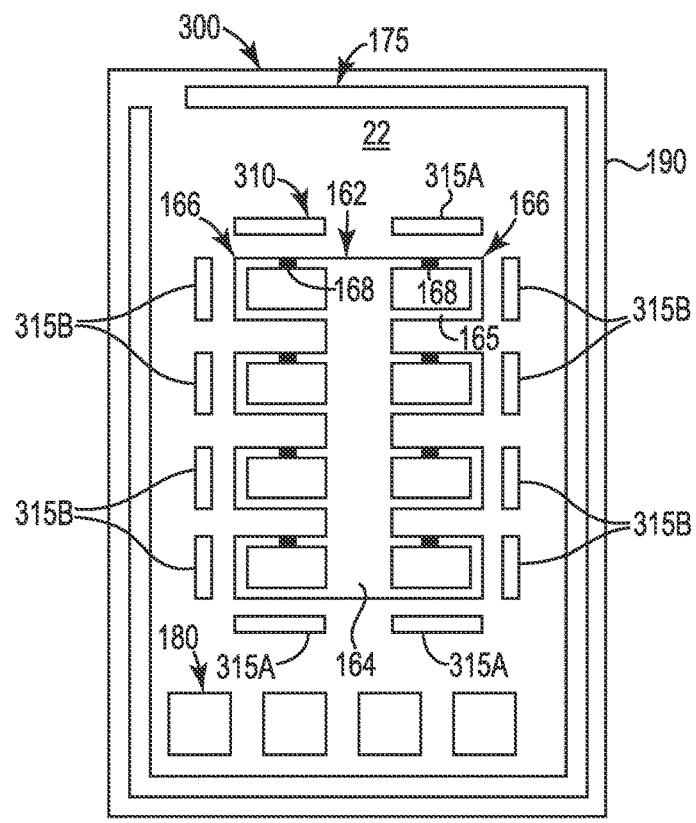
FIG. 13 is a top plan view schematically illustrating a microfluidic device, according to an example of the present disclosure.

FIG. 13 is a top plan view schematically illustrating a microfluidic device 300, according to an example of the present disclosure. In some examples, microfluidic device 300 includes at least substantially the same features and attributes as microfluidic device 160 (as previously described in association with at least FIG. 12), except for adding a first resistive structure 310 in close proximity to the microfluidic channel structure 162 while keeping first resistive structure 175 at periphery 190 of the substrate 22. In some examples, as shown in FIG. 13, first resistive structure 310 includes an array of resistive elements 315B, with each resistive element 315B located in a one-to-one correspondence with a microfluidic channel unit 166 such that at least one resistive element 315B is associated with its own channel unit 166. By doing so, the localized temperature of the substrate 22 can be managed dynamically relative to the reaction process occurring in a particular channel unit 166 and independently of reaction process occurring in other channel units 166.

As shown in FIG. 13, the resistive elements 315B are spaced apart from each other and electrically independent from one another. In some examples, the size of the resistive elements 315B is different than a size of the channel unit 166.

In some examples, the first resistive structure 310 additionally includes end elements 315A to provide further locations at which to sense and/or heat the substrate 22 to further enhance localized thermal management of the substrate 22.

With this arrangement, the first resistive structure 175 facilitates global temperature management of the substrate 22 while the elements 315A (and/or 315B) of first resistive structure 310 facilitates localized temperature management of the substrate 22 at different locations on the substrate 22. Moreover, the elements 315A of first resistive structure 310 are capable of applying heat to the substrate 22, such that the same element that senses a localized temperature (which is determined to warrant modification) also can apply heat to adjust the localized temperature at the precisely desired location on substrate 22. As previously noted, instead of or in addition to using elements 315A, 315B of first resistive structure 310 to apply heat, in some examples heat is selectively applied via the resistive elements 168 of the second resistive structure (44 in FIG. 2A).

Via such arrangements, at least first resistive structure 175 enables maintaining the entire substrate as a generally stable temperature platform while first resistive structure 310 enables making precise and rapid localized temperature adjustments to the substrate 22.

Figure 14A:
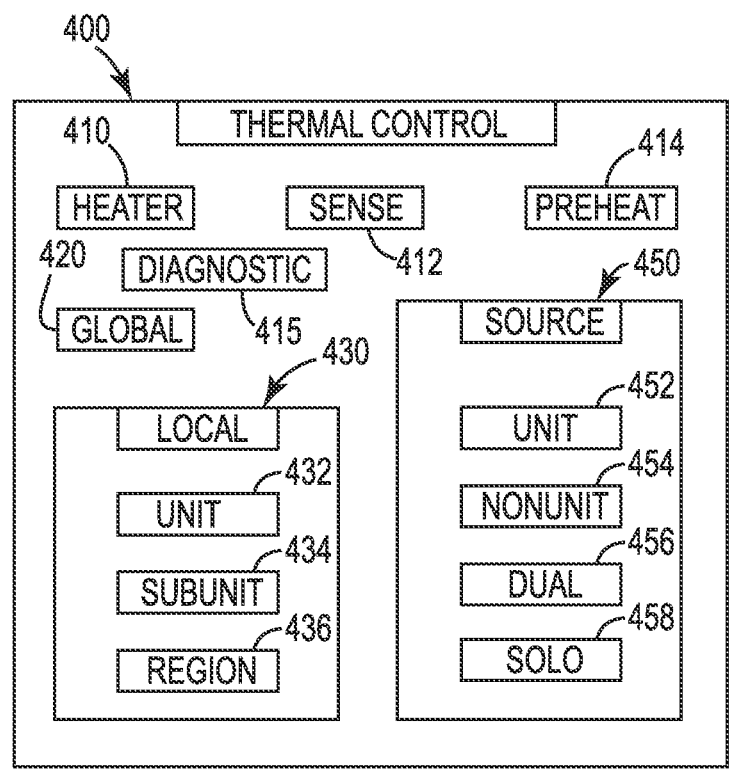
FIG. 14A is a block diagram schematically illustrating a thermal control manager, according to an example of the present disclosure.

FIG. 14A is a block diagram of a thermal control manager 400, according to an example of the present disclosure. In some examples, thermal control manager 400 operates in association with at least some of the features and attributes as the microfluidic devices previously described in association with at least FIGS. 1-13. In general terms, in some examples the thermal control manager 400 operates to manage a temperature of a substrate of a microfluidic device via controlling thermal sensing of the substrate 22 and selectively heating the substrate 22. As shown in FIG. 14A, thermal control manager 400 includes a heat function 410, a sense function 412, and pre-heat function 414.

In some examples, thermal control manager 420 includes a global parameter 420 and a local parameter 430. The global parameter 420 enables executing the heat function 410 and/or the sense function 412 regarding the entire substrate 22. The local parameter 430 enables executing the heat function 410 or the sense function 412 at particular localized positions on the substrate 22.

In some examples, heat function 410 and/or sense function 412 are executed solely via a first resistive structure (e.g. first resistive element 175 in FIG. 10 or 27 in FIG. 1)

on substrate 22, independently of second resistive structure (44 in FIG. 2A, 168 in FIG. 10) of microfluidic channel structure 30. In some examples, heat function 410 and/or sense function 412 are executed via the first resistive structure on substrate 22 in cooperation with second resistive structures in the microfluidic channel structure 30.

As shown in FIG. 14A, the local parameter 430 includes a unit function 432, a subunit function 434, and a region function 436. Via the unit function 432, the thermal control manager 400 can specify applying heat and/or sensing to the substrate 22 in association with an entire microfluidic channel unit (e.g. unit 166 in FIG. 10). Via the subunit function 434, the thermal control manager 400 can specify applying heat and/or sensing regarding the substrate 22 in association with a localized portion of an entire microfluidic channel unit (e.g. unit 166 in FIG. 10). Via the region function 436, the thermal control manager 400 can specify applying heat and/or sensing in association with a region of the substrate 22 independent of any microfluidic channel structures 30.

In some examples, thermal control manager 400 includes a source module 450 to enable selection of which source is employed to implement temperature adjustments of the substrate 22. In some examples, via unit parameter 452, heat is applied to the substrate 22 via second resistive elements 168 of microfluidic channel unit 166. In some examples, via non-unit parameter 454, heat is applied to the substrate 22 via a first resistive structure (e.g. 175 in FIG. 10). In some examples, via dual parameter 456 heat is applied to the substrate via resistive elements that have dual functions (e.g. temperature sensing and heating or e.g. pumping and heating). In some examples, via solo parameter 458, heat is applied to the substrate 22 via resistive elements that have single functionality, such as heat only.

In some examples, thermal control manager 400 resides within machine readable instructions stored in a memory associated with a controller, such as the memory 138 of control interface 106 and/or memory 114 of host device 108. Via the connections and communication pathways previously described in association with at least FIG. 3, thermal control manager 400 at least partially dictates operation of microfluidic device 20, 80, 160 and control over temperature of substrate 22 as part of maintaining thermal control over operations within microfluidic channel structure 30 (FIG. 1-2A), 162 (FIG. 10).

Figure 14B:
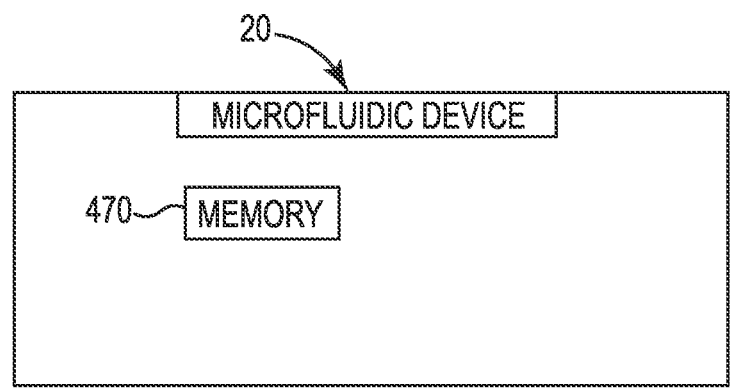
FIG. 14B is a block diagram schematically illustrating a microfluidic device including at least a memory, according to an example of the present disclosure.

In some examples, at least some of the functionality of thermal control manager 400 resides on microfluidic device 20 (FIGS. 1-13, 16-17), such as via storage of machine readable instructions (to implement those functions) in a memory 470 on microfluidic device 20, as shown in FIG. 14B with memory 470 having at least some of substantially the same features and attribute as memory 114 (FIG. 8) or memory 138 (FIG. 9). In such examples, the functionality of thermal control manager 400 on microfluidic device 20 would complement or cooperate with any remaining functionality of thermal control manager 400 present on control interface 106 (FIG. 9) and/or host device 108 (FIG. 8). In some examples, all of the functionality of fluid flow control manager 400 would be stored in memory 470 of microfluidic device 20. In some examples, when such memory 470 is present on microfluidic device 20, microfluidic device 20 also includes a controller or circuitry having some control functionality having at least some of substantially the same features and attributes as controller 134 of control interface 106 (FIG. 9) and/or controller functionality (e.g. CPU 110) of host device 108 (FIG. 8)

In some examples, as shown in FIG. 14A thermal control manager 400 includes a diagnostic function 415 by which a relative operational health of the microfluidic device 20 is determined. In particular, via diagnostic function 415, prior to the microfluidic device (20 in FIG. 1, 80 in FIG. 4A) receiving a fluid sample, preheat function 414 is applied and temperatures obtained via sense function 412 are observed. Per diagnostic function 415, the global temperature and/or local temperatures of the substrate 22 are compared to a reference, such as per feedback loop 51 in FIG. 2B. Any unsatisfactory deviations revealed via this comparison enable determining whether the various microfluidic components are functioning correctly. Any confirmed dysfunction can suggest discarding the microfluidic device to avoid a corrupted or false test result, and/or suggest that other corrective actions be taken.

Figure 15:
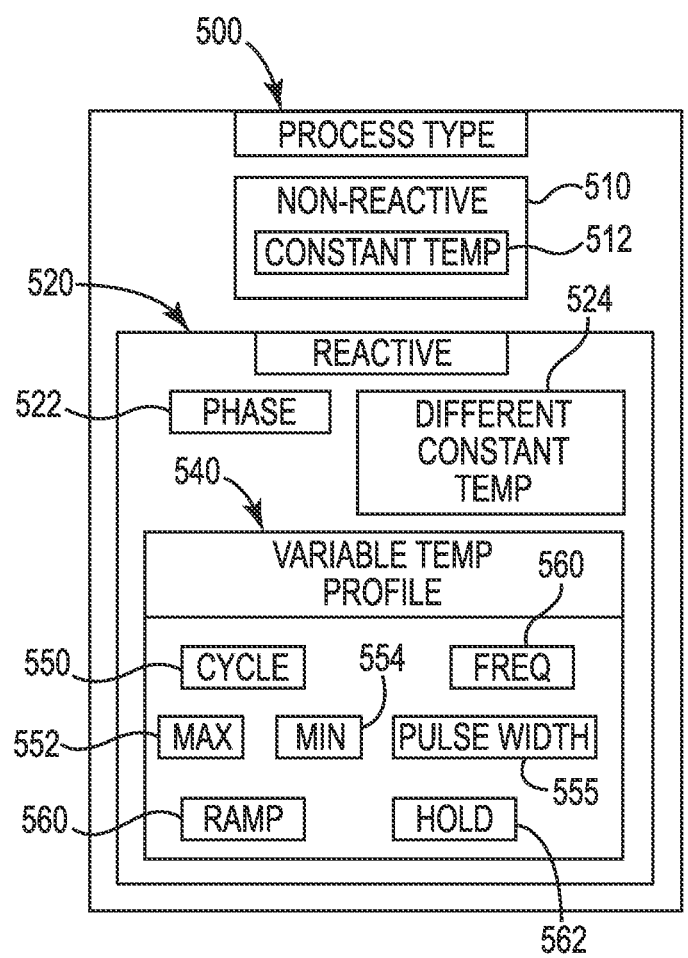
FIG. 15 is a block diagram schematically illustrating a process type module, according to an example of the present disclosure.

FIG. 15 is a block diagram of a process type module 500, according to an example of the present disclosure. In some examples, process type module 500 operates in association with at least some of the features and attributes as the microfluidic devices previously described in association with at least FIGS. 1-13 and/or in association with at least some of the features and attributes as the thermal control manager 400 previously described in association with at least FIG. 14A. As shown in FIG. 15, process type module 500 includes a non-reactive process function 510 to implement thermal control management to maintain a substantially constant temperature of the substrate for generally non-reactive processes on the microfluidic device. It will be understood that in some examples the term non-reactive refers to those operations of the microfluidic device occurring after initial mixing/reaction of the fluid sample 67 (FIG. 3) with reagents 66 to dilute and stabilize the fluid sample.

In some examples, process type module 500 includes a reactive process module 520 to implement thermal control management of the substrate in association with reactive processes to occur on the microfluidic device 20.

In some examples, the reactive process module 520 includes a selectively activatable phase function 522 to select temperature parameters for the substrate 22 for each phase of a reaction process, as desired. In some examples, the reactive module 520 includes a different constant temperature function 524 to enable selecting different constant temperatures of the substrate 22 with each different constant temperature suited for a particular reaction process or phase of a reaction process.

In some examples, as shown in FIG. 15 the reactive process module 520 includes a variable temperature profile function 540, which in general terms implements thermal control management of the substrate 22 in association with reactive processes (to occur on the microfluidic device 20) that involve variable temperature profiles. For example, one type of reaction process implementable via microfluidic devices (in some examples of the present disclosure) includes polymerase chain reactions (PCR), which rely on variable temperature profiles to drive reaction processes. Accordingly, the variable temperature profile function 540 includes a cycle parameter 550 to define temperature cycles via a maximum temperature parameter 552, a minimum temperature parameter 554, a pulse width parameter 555, and a frequency parameter 560. A ramp parameter 561 sets how rapidly a temperature will increase for each cycle while the hold parameter 562 sets how long an elevated temperature in a given cycle will be maintained.

In some examples, at least some of the functionality of process type module 500 resides on microfluidic device 20 (FIGS. 1-13, 16-17), such as via storage of machine readable instructions (to implement those functions) in a memory 470 on microfluidic device 20, as shown in FIG. 14B with memory 470 having at least some of substantially the same features and attribute as memory 114 (FIG. 8) or memory 138 (FIG. 9). In such examples, the functionality of process type module 400 on microfluidic device 20 would complement or cooperate with any functionality of process type module 500 present on control interface 106 (FIG. 9) and/or host device 108 (FIG. 8). In some examples, all of the functionality of process type module 500 would be stored in memory 470 of microfluidic device 20. In some examples, when such memory 470 is present on microfluidic device 20, microfluidic device 20 also includes a controller or circuitry having some control functionality having at least some of substantially the same features and attributes as controller 134 of control interface 106 (FIG. 9) and/or controller functionality (e.g. CPU 110) of host device 108 (FIG. 8)

Figure 16:
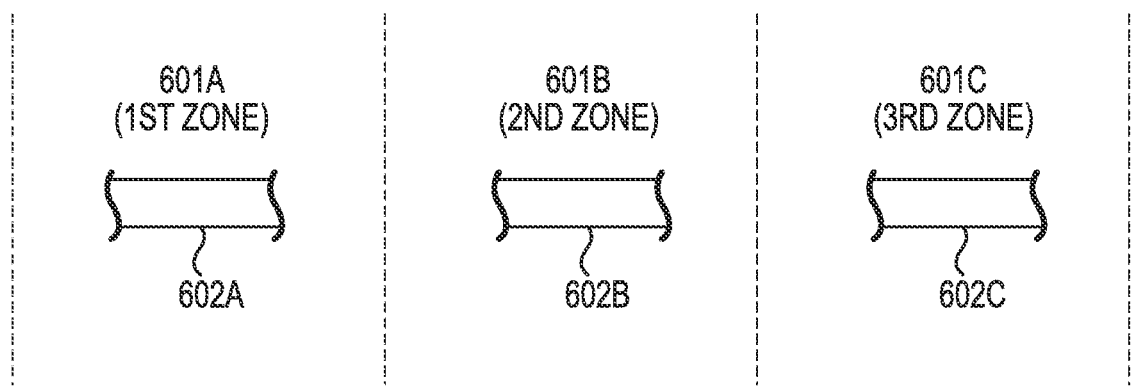
FIG. 16 is a diagram schematically illustrating a series of thermal control zones of a microfluidic device, according to an example of the present disclosure.

FIG. 16 is a side view schematically illustrating a processing portion 600 of a microfluidic channel structure, according to an example of the present disclosure. In some examples, the processing portion 600 forms part of a microfluidic device having at least some of substantially the same features and attributes as microfluidic device 20, 80 as previously described in association with at least FIGS. 1-10, and with processing portion 600 including at least some of substantially the same features and attributes of the microfluidic devices previously described in association with FIGS. 11-15.

As shown in FIG. 16, processing portion 600 includes a series of thermal control zones 601A ($1^{st}$ Zone), 601B ($2^{nd}$ Zone), 601C ($3^{rd}$ Zone) shown separated by dashed lines. Each different zone 601A, 601B, 601C is provided to manage thermal control of substrate 22 for a different aspect or step of a reaction process. For example, as depicted in FIG. 16, first zone 601A maintains thermal control for a first portion of reaction process independently of a second zone 601B, which maintains thermal control of substrate 22 for a second portion of a reaction process. Similar, third zone 601C maintains thermal control of substrate 22 for a third portion of a reaction process independently of the second zone 601B or first zone 601A.

In each zone, a channel portion 602A, 602B, 602C has its own thermal sense resistor(s), each located as desired relative to the fluid actuators, heaters, and attribute sensors within each respective channel portion 602A, 602B, 602C.

While not depicted in FIG. 16 for illustrative simplicity, it will be understood that in some examples, the different zones 601A, 601B, 601C do not immediately follow on another but can have other channel portions or components (e.g. pumps, heaters, other attribute sensors, flow rate sensors, etc.) between adjacent or successive zones 601A, 601B, 601C.

Figure 17:
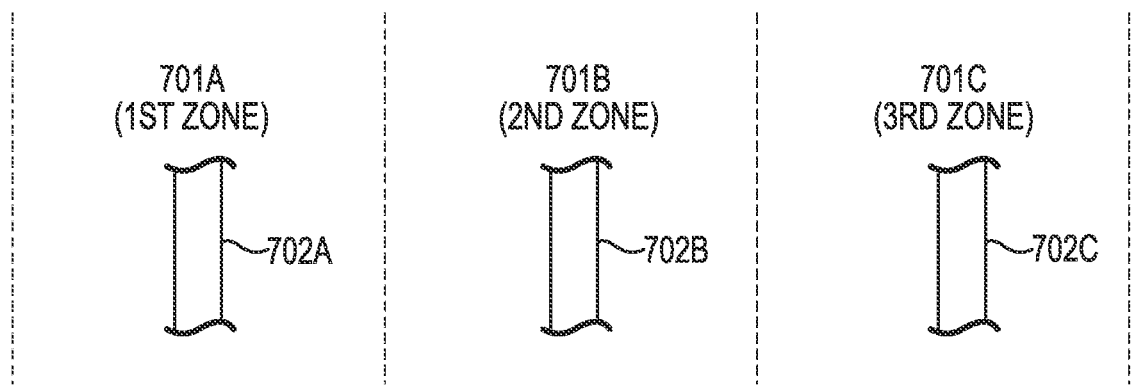
FIG. 17 is a diagram schematically illustrating parallel thermal control zones of a microfluidic device, according to an example of the present disclosure.

FIG. 17 is a diagram schematically illustrating a processing portion 700 of a microfluidic channel structure, according to an example of the present disclosure. In some examples, the processing portion 700 has at least some of substantially the same features and attributes as processing portion 700, except instead of arranging the different zones 701A, 701B, 701C (with each including their respective features and attributes) in series, the processing portion 700 provides similar zones 701A, 701B, 701C in parallel, each having a corresponding channel portion 702A, 702B, 702C. Accordingly, the processing portion 700 provides multiple, thermal control zones of substrate 22 operating in parallel. In some examples, all three channel portions 702A, 702B, 702C are in fluid communication with a common reservoir, such as reservoir 214 (FIG. 10). By arranging different thermal control zones of substrate 22 in parallel, reaction processes can be driven at different temperatures independent from one another. In other words, each thermal control zone can maintain its portion of the substrate 22 at a temperature independent of the temperature of the substrate 22 in the other thermal control zones.

At least some examples provide for thermal control of a microfluidic device via maintaining the substrate (or portions of the substrate) at a desired temperature to establish targeted temperature platform(s) for microfluidic components and operations supported by the substrate. By doing so, more precise and stable control of temperatures within the microfluidic channels may be achieved.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein.

The invention claimed is:

1. A biologic test chip comprising:
   a substrate;
   a microfluidic channel structure on the substrate;
   a first resistive structure on the substrate to selectively heat the substrate and to selectively sense a temperature of the substrate to control the temperature of at least the substrate, wherein the first resistive structure is separate from and independent of the microfluidic channel structure;
   wherein the first resistive structure comprises a plurality of first resistive structures, and wherein a first one of the first resistive structures has a shape and size generally corresponding to a shape and size of a periphery of the substrate, and
   wherein a second one of the first resistive structures has a shape and size generally dissimilar to the shape and size of the periphery of the substrate and is electrically independent from the first one of the first resistive structures.

2. The chip of claim 1, comprising:
   a plurality of second resistive structures located in the microfluidic channel structure, at least some of the second resistive structures to selectively pump fluid and to selectively apply heat within the microfluidic channel structure,
   wherein the first resistive structure is electrically independent from the second resistive structures.

3. The chip of claim 2, wherein the first resistive structure has a resistivity and a thermal coefficient of resistance that are substantially different than a resistivity and a thermal coefficient of resistance of a second resistive structure of the plurality of second resistive structures.

4. The chip of claim 1, wherein the first resistive structure has lengths and shapes substantially dissimilar from a shape and length of the microfluidic channel structure.

5. The chip of claim 1, wherein the microfluidic channel structure includes a plurality of different microfluidic channel units, wherein a one-to-one correspondence exists between each first resistive structure and a microfluidic channel unit of the plurality of different microfluidic channel units.

6. A biologic microfluidic device comprising:
   a substrate;
   a microfluidic channel structure on the substrate;
   a non-transitory computer-readable medium including instructions operable by a controller;
   a plurality of first resistive structures on the substrate separate from and independent of the microfluidic channel structure, wherein the instructions are to operate the first resistive structures to selectively heat the substrate and to selectively sense a temperature of the substrate at a location of each first resistive structure;
   a plurality of second resistive structures located in the microfluidic channel structure and electrically independent from the first resistive structures, wherein the instructions are to operate at least some of the second resistive structures to selectively pump fluid and apply heat to the fluid within the microfluidic channel structure without pumping the fluid, wherein the temperatures sensed via at least some of the first resistive structures provide a feedback loop to at least partially determine whether heat is to be selectively applied to the substrate via at least one of the first resistive structures and at least some of the second resistive structures.

7. The biologic microfluidic device of claim 6, further comprising:

an input/output module in communication with the second resistive structures to enable the controller to make a determination regarding which second resistive structures will apply heat, the determination being made according to locations of the second resistive structures relative to the sensed temperature at the corresponding location of a first resistive structure of the first resistive structures.

8. The biologic microfluidic device of claim 6, comprising:

an input/output module in communication with at least the first resistive structures and the second resistive structures to receive feedback loop information regarding the sensed temperature to enable the controller to initiate a command signal to cause the selective application of heat.

9. The biologic microfluidic device of claim 6, wherein the microfluidic channel structure comprises an array of independent microfluidic channel units, with each independent microfluidic channel unit defining a reaction process independent from reaction processes in other independent microfluidic channel units, wherein a first resistive structure of the first resistive structures corresponds with an independent microfluidic channel unit of the independent microfluidic channel units.

10. A biologic microfluidic system comprising:

a controller:

a biologic microfluidic device comprising:

a substrate;

a microfluidic channel structure on the substrate;

a first resistive array on the substrate separate from and independent of the microfluidic channel structure, wherein the controller is configured to operate the first resistive array to selectively heat the substrate and to selectively sense localized temperatures of the substrate at spaced apart locations on the substrate;

a second resistive array located within the microfluidic channel structure, wherein the controller is configured to operate the second resistive array to selectively pump fluid and apply heat without pumping fluid, the second resistive array being electrically independent from the first resistive array;

an input/output module to communicate a sensed localized temperature of the localized temperatures to the controller for determination of the selective application of heat via at least one of the first resistive array and the second resistive array to achieve a selectively variable temperature protocol in at least one reaction process within the microfluidic channel structure.

11. The biologic microfluidic system of claim 10, wherein the first resistive array comprises a plurality of first resistive elements spaced apart from each other in a pattern at least partially surrounding the microfluidic channel structure.

12. The biologic microfluidic system of claim 11, wherein the second resistive array comprises a plurality of second resistive elements at spaced apart locations within the microfluidic channel structure, wherein a size and shape of at least some of the second resistive elements are substantially different than a size and shape of the microfluidic channel structure.

13. The biologic microfluidic system of claim 10, wherein the controller is configured to operate the first resistive array via the input/output module in a diagnostic mode, prior to intake of a fluid sample within the microfluidic device, to compare a sensed temperature to a reference temperature to determine whether a deviation of the sensed temperature from the reference temperature indicates correct functioning of the biologic microfluidic device.

14. The biologic microfluidic system of claim 10, wherein the controller is configured to operate the second resistive array at a high intensity and short pulse width to pump fluid and at a low intensity and long pulse width to apply heat to the fluid, wherein the low intensity and long pulse width provides insufficient energy to cause fluid displacement.

* * * * *